(12) United States Patent
Kubō et al.

(10) Patent No.: US 6,291,826 B1
(45) Date of Patent: Sep. 18, 2001

(54) SEMICONDUCTOR ELEMENT FOR ELECTRIC POWER WITH A DIODE FOR SENSING TEMPERATURE AND A DIODE FOR ABSORBING STATIC ELECTRICITY

(75) Inventors: Mitsunori Kubō, Hiroshima; Takeshi Ohmaru, Fukuoka; Takaaki Shirasawa; Gourab Majumdar, both of Tokyo, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/705,755

(22) Filed: Nov. 6, 2000

(30) Foreign Application Priority Data

Jun. 19, 2000 (JP) .............................................. P12-182928

(51) Int. Cl.$^7$ ...................................................... G01T 1/24
(52) U.S. Cl. ................................. 250/370.15; 250/338.4; 323/907
(58) Field of Search .................................... 323/284, 907, 323/282; 327/535, 564, 513; 250/370.01, 370.15, 338.4

(56) References Cited

U.S. PATENT DOCUMENTS 3,648,153 * 3/1972 Graf ....................................... 323/907
4,918,590 * 4/1990 Ohtuka et al. ......................... 363/37
6,211,520 * 4/2001 Ishikawa et al. ................... 250/338.1

OTHER PUBLICATIONS

U.S. patent application No. Ser. 09/767,226, Filed Jan. 23, 2001, claims, abstract, & Drawings.

* cited by examiner

*Primary Examiner*—Shawn Riley
(74) *Attorney, Agent, or Firm*—Oblon, Spivak, McClelland, Maier & Neustadt, P.C.

(57) ABSTRACT

A first diode part (1B) for sensing junction temperature and a second diode part (1C) for absorbing static electricity that are included in a semiconductor element (1) for electric power are formed within the same substrate together with a semiconductor element part (1A) for electric power. Moreover, the number of a plurality of second diodes (1CD) constituting the second diode part (1C) is equal to the number of a plurality of first diodes (1BD) constituting the first diode part (1B). In addition, a capacitor (11) for reducing the impedance is disposed between the input terminals of a forward direction voltage fall operating amplifying circuit part (4) of a controlling circuit part (8). Here, it is effective to form an LC low pass filter as well by covering a forward path side relay lead part (9A) and a backward path side relay lead part (9B) with one tubular ferrite core.

13 Claims, 9 Drawing Sheets

(a) : TEMPERATURE-SENSING DIODE PART
(b) : ELECTROSTATIC DISCHARGE RESISTANCE IMPROVING DIODE PART

SEMICONDUCTOR ELEMENT FOR ELECTRIC POWER WITH A DIODE FOR SENSING TEMPERATURE AND A DIODE FOR ABSORBING STATIC ELECTRICITY

BACKGROUND OF THE INVENTION

1. Field of the Invention

The present invention relates to a semiconductor element for electric power and a semiconductor device for electric power, and more particularly to a technique for reducing the high-frequency noise of a semiconductor device for electric power having a temperature-sensing function.

2. Description of the Background Art

A control system utilizing a semiconductor element for electric power with a temperature-sensing diode is used in order to avoid deterioration or the like of element properties caused by an abnormal junction temperature rise at the time of operation of a semiconductor element for electric power such as represented by an IGBT or a longitudinal type power MOSFET. In other words, a temperature-sensing diode part which is made of a polycrystal silicon diode and which is electrically separated completely from a semiconductor element part for electric power with the use of an insulating oxide film is formed within the semiconductor substrate in which the semiconductor element part for electric power is formed. A sensing signal indicating the amount of junction temperature rise of the semiconductor element part for electric power, which has been sensed by the temperature-sensing diode part, is transmitted to a controlling circuit part disposed outside of the semiconductor element for electric power, and the controlling circuit part performs a comparing operation of the received sensing signal with a predetermined level and, on the basis of the operation result, controls the semiconductor element part for electric power appropriately, thereby avoiding the deterioration or the like of the properties of the semiconductor element part for electric power caused by junction temperature rise.

In this case, input terminals of the temperature-sensing diode part made of a polycrystal silicon diode and input terminals of the controlling circuit part are connected, for example, with the use of a lead part made of a pair of bonding wire parts and a pair of relay lead parts; and the semiconductor element for electric power and the controlling circuit part are accommodated in a resin case.

Here, the resin case is joined onto an upper surface of a heat-dissipating plate along an outer peripheral part. The semiconductor element for electric power including the temperature-sensing diode part is stuck onto an electrically insulating substrate formed on the heat-dissipating plate.

Further, Japanese Patent Application Laid-open No. 07-202129(1995) discloses a semiconductor element for electric power equipped with a temperature-sensing diode part and an electrostatic absorbing diode part. Namely, referring to FIG. 9, a temperature-sensing diode part made of a plurality of diodes connected sequentially in series in the forward direction is formed on a semiconductor substrate on which a longitudinal type MOSFET is formed, and an electrostatic discharge resistance improving diode part made of one diode connected in parallel in the backward direction is formed between an anode electrode at one end of the temperature-sensing diode part and a cathode electrode at the other end. The latter one diode has a function of being capable of preventing erroneous operations of the temperature-sensing diode part caused by static electricity generated between the two terminals of the former temperature-sensing diode part. For example, a resistance voltage of 200V can be ensured by using the latter static electricity absorbing diode part. Thus, by constructing the semiconductor element for electric power in the manner shown in FIG. 9, the ESD (electrostatic discharge) immunity can be improved while sensing the junction temperature rise of the semiconductor element part for electric power.

In the semiconductor element for electric power disclosed by the aforementioned Patent Application, if the number of diodes connected in series in the temperature-sensing diode part is increased as much as possible within the range of the power source voltage of a later-mentioned forward direction voltage fall (VF) comparing circuit of the controlling circuit part, the sensitivity of the temperature-sensing diode part to temperature change increases to improve the sensing precision. Conversely, if the temperature-sensing diode part is constructed with only one diode, the sensitivity decreases to comparatively lower the precision, so that it is hardly conceivable to construct the temperature-sensing diode part with a single diode.

Next, FIG. 10 shows a circuit block diagram of a semiconductor device incorporating a semiconductor element 1P for electric power shown in FIG. 9. As described previously, each part of the semiconductor device of FIG. 10 is accommodated in the resin case joined on the upper surface of the heat-dissipating plate along the outer peripheries. As shown in FIG. 10, a controlling circuit part 8P formed on a substrate for controlling circuits (not illustrated) is constructed with a semiconductor element controlling circuit part 2P for controlling the semiconductor element for electric power, a circuit part 3P for generating a controlling current IF supplied to a temperature-sensing diode part 5AP, and a VF operating amplifying circuit part 4P for sensing an abnormal junction temperature rise by comparing a forward direction voltage fall (VF), which is a sensing signal of the temperature-sensing diode part 5AP, with a predetermined level. Here, the symbol 1PP denotes an IGBT element part, and the symbol 5BP denotes one diode that constitutes a static electricity absorbing diode part.

The conventional semiconductor device for electric power incorporating the semiconductor element 1P for electric power shown in FIG. 10 involves the following problems although it contributes to an improvement of the ESD (electrostatic discharge) immunity. Namely, if a high-frequency electromagnetic interference wave penetrating from the outside is generated in the inside of the semiconductor device for electric power, particularly in the neighborhood of the semiconductor element 1P for electric power, or if a higher-mode electromagnetic interference wave generated by the aforesaid semiconductor element 1P for electric power itself is generated in the neighborhood of the semiconductor element 1P for electric power, an electromotive force is generated as a result of electrostatic coupling and electromagnetic coupling generated between the heat-dissipating plate and the paths (including the forward path and the backward path) of the controlling current IF of the temperature-sensing diode part constructed with a bonding wire part 10P and a relay lead part 9P, or between the aforementioned paths and the earth ground of the semiconductor device for electric power, or between the aforementioned paths and the electrode (gate electrode, control electrode, or the like) for large electric current that is input to and output from the semiconductor element for electric power. This electromotive force is generated in the same manner in each of the forward path and the return path of the above-mentioned controlling current IF and, as a result, an electromotive force difference is generated between the forward path and the return path.

Here, the high-frequency electromagnetic interference wave penetrating from the outside of the semiconductor device for electric power into the semiconductor device may be, for example, a radio wave noise, a wireless noise generated from a wireless apparatus, a wireless noise generated by a portable phone, or the like. Generation of such a high-frequency electromagnetic interference wave in the neighborhood of the semiconductor element for electric power occurs often, for example, if the semiconductor device for electric power is used as an electronic part in a mobile body such as an automobile. The frequency band for such a high-frequency electromagnetic interference wave extends, as an example, to the range of about 1 MHz to 10 GHz. Needless to say, electromagnetic interference waves below or above that range may be a cause of the problem mentioned herein. Here, the noise caused by an electromagnetic interference wave, which is the problem mentioned herein, is referred to as "common mode".

Further, if a magnetic line of force of an electromagnetic interference wave links with an electric current loop made of the forward path and the return path of the controlling current IF, an electromotive force is generated in the aforesaid electric current loop due to electromagnetic induction. The noise of this case is a noise referred to as "normal mode".

Thus, electromotive force generating modes of the former and the latter both appear as a high-frequency noise on a forward direction voltage fall (VF) signal (approximately corresponding to a DC voltage signal) generated between the two terminals of the temperature-sensing diode part. If these two modes induce a large electromotive force as compared with the sensitivity (temperature coefficient) of the temperature-sensing diode part, a troublesome inconvenience is generated in the operation of the VF operating amplifying circuit part that receives the forward direction voltage fall (VF) signal of the temperature-sensing diode part to execute an operation of comparing the received signal with a predetermined level, thereby raising a problem that the level of the electromagnetic interference wave immunity (EMI) goes down. In other words, if the junction temperature at the time of the operation of the semiconductor element part for electric power rises, the sum of the forward direction voltage falls in the temperature-sensing diode part changes in accordance therewith, and the level of the noise electromotive force goes up to such an extent that the controlling circuit part cannot accurately acquire the data signal thus changed. Therefore, the controlling circuit part cannot sense the amount of the junction temperature rise of the semiconductor element part for electric power with good precision for controlling.

SUMMARY OF THE INVENTION

According to a first aspect of the present invention, a semiconductor element for electric power comprises: a semiconductor substrate; a semiconductor element part for electric power formed on the semiconductor substrate; a first diode part formed on the semiconductor substrate for sensing a temperature of the semiconductor element part for electric power; and a second diode part formed on the semiconductor substrate and connected between two terminals of the first diode part for absorbing static electricity, wherein the first diode part comprises a plurality of first diodes connected sequentially in a forward direction, the second diode part comprises at least one second diode connected in a backward direction, and a high frequency impedance characteristic of the second diode part in a frequency band of an electromagnetic interference wave that can be generated in a neighborhood of the semiconductor element part for electric power is equivalent to a high frequency impedance characteristic of the first diode part in the frequency band.

According to a second aspect of the present invention, the second diode part comprises a plurality of second diodes connected sequentially in the backward direction, the number of the plurality of second diodes is equal to the number of the plurality of first diodes, and a high frequency impedance characteristic of each of the plurality of second diodes in the frequency band is equivalent to a high frequency impedance characteristic of each of the plurality of first diodes in the frequency band.

According to a third aspect of the present invention, a semiconductor device for electric power comprises: the semiconductor element for electric power according to the first aspect; a forward path side lead part having one end connected to an anode side terminal of the first diode part of the semiconductor element for electric power; a backward path side lead part having one end connected to a cathode side terminal of the first diode part of the semiconductor element for electric power; an operating amplifying circuit part having an input terminal connected to the other end of the forward path side lead part; a control current generating circuit part connected to the other end of the forward path side lead part and configured to generate a control current of the first diode part; and an element controlling circuit part having a control terminal connected to an output terminal of the operating amplifying circuit part and having an output terminal connected to a control electrode of the semiconductor element part for electric power of the semiconductor element for electric power.

According to a fourth aspect of the present invention, the semiconductor device for electric power further comprises: a capacitor having one end connected to the other end of the forward path side lead part and having the other end connected to the other end of the backward path side lead part, wherein the capacitor has an impedance characteristic such that an impedance thereof in the frequency band is lower than an impedance thereof outside the frequency band.

According to a fifth aspect of the present invention, the forward path side lead part comprises: a forward path side bonding wire part having one end connected to the anode side terminal; and a forward path side relay lead part having one end connected to the other end of the forward path side bonding wire part, and the backward path side lead part comprises: a backward path side bonding wire part having one end connected to the cathode side terminal; and a backward path side relay lead part having one end connected to the other end of the backward path side bonding wire part, and the forward path side relay lead part and the backward path side relay lead part are surrounded by a ferrite core part.

According to a sixth aspect of the present invention, the ferrite core part is made of one tubular ferrite core.

According to a seventh aspect of the present invention, the ferrite core part comprises a tubular first ferrite core and a tubular second ferrite core, the forward path side relay lead part is surrounded by the first ferrite core, and the backward path side relay lead part is surrounded by the second ferrite core.

According to an eighth aspect of the present invention, the semiconductor device for electric power further comprises: a dielectric that is sandwiched between respective facing parts of the forward path side lead part and the backward path side lead part.

According to a ninth aspect of the present invention, the semiconductor device for electric power further comprises:

a dielectric that is sandwiched between respective facing parts of the forward path side lead part and the backward path side lead part.

According to a tenth aspect of the present invention, a semiconductor device for electric power comprises: the semiconductor element for electric power according to the second aspect; a forward path side lead part having one end connected to an anode side terminal of the first diode part of the semiconductor element for electric power; a backward path side lead part having one end connected to a cathode side terminal of the first diode part of the semiconductor element for electric power; an operating amplifying circuit part having an input terminal connected to the other end of the forward path side lead part; a control current generating circuit part connected to the other end of the forward path side lead part and configured to generate a control current of the first diode part; and an element controlling circuit part having a control terminal connected to an output terminal of the operating amplifying circuit part and having an output terminal connected to a control electrode of the semiconductor element part for electric power of the semiconductor element for electric power.

According to an eleventh aspect of the present invention, the semiconductor device for electric power further comprises: a capacitor having one end connected to the other end of the forward path side lead part and having the other end connected to the other end of the backward path side lead part, wherein the capacitor has an impedance characteristic such that an impedance thereof in the frequency band is lower than an impedance thereof outside the frequency band.

According to a twelfth aspect of the present invention, the forward path side lead part comprises: a forward path side bonding wire part having one end connected to the anode side terminal; and a forward path side relay lead part having one end connected to the other end of the forward path side bonding wire part, the backward path side lead part comprises: a backward path side bonding wire part having one end connected to the cathode side terminal; and a backward path side relay lead part having one end connected to the other end of the backward path side bonding wire part, and the forward path side relay lead part and the backward path side relay lead part are surrounded by a ferrite core part.

According to a thirteenth aspect of the present invention, the semiconductor device for electric power further comprises: a dielectric that is sandwiched between respective facing parts of the forward path side lead part and the backward path side lead part.

According to the first to third aspects of the invention, if the semiconductor element part for electric power is incorporated in the semiconductor device for electric power, even if high-frequency electromagnetic interference waves are generated in the neighborhood of the semiconductor element part for electric power, the electromotive force difference generated between the forward path side lead part and the backward path side lead part can be reduced, thereby reducing the degree of influence of the electromagnetic interference waves on the sensitivity of the first diode part. This allows the operating amplifying circuit part to receive a signal which has reduced noise signals as compared with conventional ones and which is nearer to the original sensing signal of the first diode part, so that the element controlling circuit part can control the semiconductor element part for electric power with higher precision than before.

According to the fourth aspect of the invention, in the frequency band of the electromagnetic interference waves, the capacitor can function as a low pass filter that shuts off the transmission of the electromotive force difference generated between the forward path side lead part and the backward path side lead part to the two input terminals of the operating amplifying circuit part, the degree of influence of the electromagnetic interference waves on the sensitivity of the first diode part can be further reduced, whereby the operating amplifying circuit part can receive a signal which has further reduced noise signals and which is further nearer to the original sensing signal of the first diode part.

According to the fifth and seventh aspects of the invention, owing to the presence of the ferrite core part, an inductance having a comparatively large value is generated in each of the forward path side relay lead part and the backward path side relay lead part, the LC low pass filter made of these inductances and the capacitor sufficiently shuts off the transmission of the electromotive force difference generated between the forward path side lead part and the backward path side lead part to the two input terminals of the operating amplifying circuit part, whereby the degree of influence of the electromagnetic interference waves on the sensitivity of the first diode part can be still further reduced.

According to the sixth aspect of the invention, since the ferrite core part in particular is made of one tubular ferrite core, the noise damping effect of the LC low pass filter generated between the two input terminals of the operating amplifying circuit part can be further enhanced, whereby the degree of influence of the electromagnetic interference waves on the sensitivity of the first diode part can be yet still further reduced.

According to the eighth aspect of the invention, due to the presence of the dielectric, the inductance components that the forward path side lead part and the backward path side lead part respectively have can be reduced, so that the electromotive voltage that can be generated in each of the forward path side lead part and the backward side lead part by electromagnetic induction caused by the generation of the electromagnetic interference waves can be reduced. Through this point, the present invention can contribute to restraint of the degree of influence of the electromagnetic interference waves on the sensitivity of the first diode part. Moreover, according to this aspect of the invention, since the forward path side lead part and the backward path side lead part are disposed to face each other so as to allow a dielectric to be sandwiched therebetween, the dimension between the two lead parts can be reduced, and the area of the electric current loop from the other end of the forward path side lead part to the other end of the backward path side lead part via the first diode part and the second diode part can be outstandingly reduced. This can sufficiently reduce the number of magnetic fluxes of the electromagnetic interference waves that link with the aforesaid electric current loop, whereby the electromotive force that can be generated in the forward path side lead part and the backward path side lead part can be sufficiently reduced. Through this point also, the present invention can further contribute to restraint of the degree of influence of the electromagnetic interference waves on the sensitivity of the first diode part.

It is therefore an object of the present invention to reduce as much as possible the influence given to the sensitivity of the temperature-sensing diode part by the electromotive force generated by coupling between the path of the controlling current to be applied to the temperature-sensing diode part and the heat-dissipating plate, the earth ground, or the electrode of the semiconductor element part for electric power. Furthermore, another object of the present invention is to reduce the inductance of the relay lead part.

These and other objects, features, aspects, and advantages of the present invention will become more apparent from the following detailed description of the present invention when taken in conjunction with the accompanying drawings.

DESCRIPTION OF THE PREFERRED EMBODIMENTS (Points Aimed at and Summary of the Preferred Embodiments)

Figure 9:
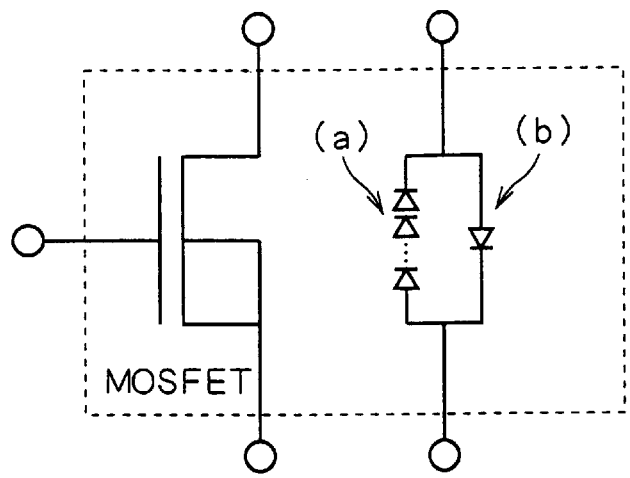
FIG. 9 is a view illustrating a construction of a MOSFET with a temperature-sensing diode of the background art.

As described previously, if an electromagnetic interference wave is generated in the neighborhood of the semiconductor element for electric power, an electromotive force is generated in each of the forward path and the backward path of the controlling current IF by electrostatic coupling and electromagnetic coupling, and these electromotive forces change into an electromotive force difference between the forward path and the backward path (or the return path) and hence to a high-frequency noise between the two input terminals of the VF operating amplifying circuit part. The first factor that causes such generation of a noise of the common mode seems to be the construction itself of the semiconductor element for electric power shown in FIG. 9. In other words, in the semiconductor element for electric power shown in FIG. 9, a temperature-sensing diode part (a) made of a plurality of diodes connected in the forward direction and one static electricity absorbing diode part (b) connected in the backward direction between the anode terminal and the cathode terminal of the aforesaid diode part (a) are formed within the same semiconductor substrate. Further, the impedance characteristic (hereafter referred to as high-frequency impedance characteristic) that each PN junction diode formed within the same semiconductor substrate has in the frequency band of electromagnetic interference waves that may possibly be generated in the neighborhood of the semiconductor element for electric power seems to be approximately the same. Therefore, in the semiconductor element for electric power shown in FIG. 9, there is an unbalance between the high-frequency impedance characteristic of the temperature-sensing diode part and the high-frequency impedance characteristic of the static electricity absorbing diode part. This point applies similarly in the semiconductor element 1P for electric power shown in FIG. 10. Therefore, an electromotive force difference is generated as a common mode noise between the forward path part and the backward path part of the controlling current IF, and moreover, since the degree of unbalance between the high-frequency impedance characteristics of the two diode parts is considerably large, the above-mentioned noise seems to be induced as a large electromotive voltage as compared with the temperature coefficient of the temperature-sensing diode part.

Therefore, as a first solution, a semiconductor device for electric power according to this preferred embodiment is constructed in such a manner that a static electricity absorbing diode part of a semiconductor element for electric power used in this semiconductor device has a high-frequency impedance characteristic equivalent to the high-frequency impedance characteristic of a temperature-sensing diode part. More preferably, assuming that the high-frequency impedance characteristic of each PN junction diode formed within the same semiconductor substrate is approximately the same, the static electricity absorbing diode part is constructed with a plurality of diodes connected in the backward direction, and the number of the plurality of diodes constituting the static electricity absorbing diode part is made equal to the number of the plurality of diodes constituting the temperature-sensing diode part.

Figure 10:
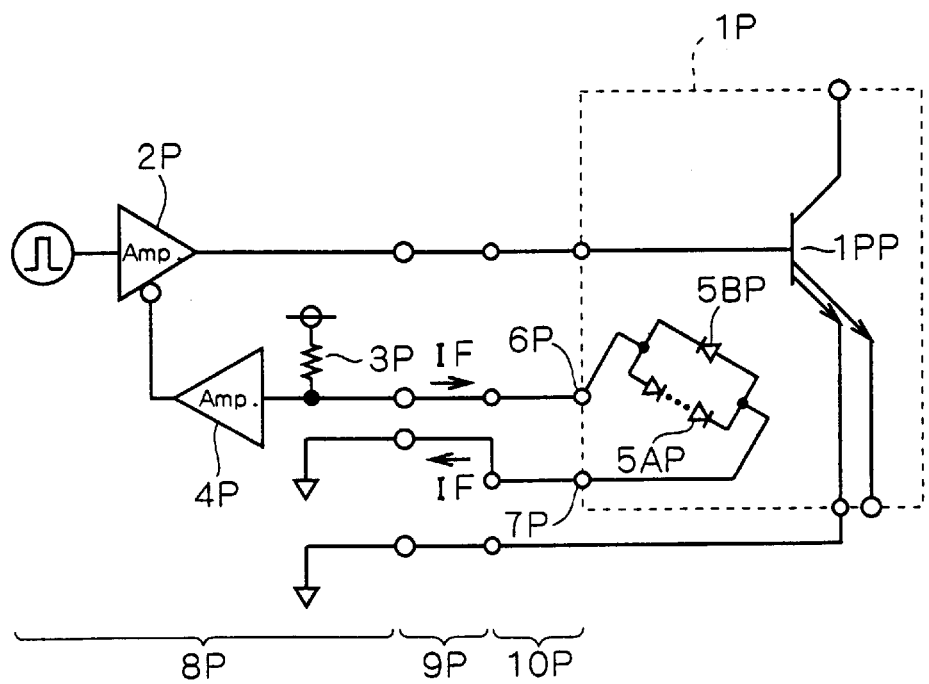
FIG. 10 is a block diagram illustrating a circuit construction of a conventional semiconductor device for electric power using an IGBT with a temperature-sensing diode.

Further, the second factor that causes generation of the electromotive force by the common mode noise seems to be the unbalance between the input impedance characteristics (the impedance characteristics in the above-mentioned frequency band of the electromagnetic interference waves) of the two input terminals of the VF operating amplifying circuit part 4P shown in FIG. 10. However, since the unbalance of these input impedance characteristics cannot be removed, it is necessary to devise a plan for preventing decrease in the EMI level while accepting this unbalance.

Therefore, as a second solution, the semiconductor device for electric power according to this preferred embodiment is constructed in such a manner that a capacitor (for example, a ceramic capacitor) capable of functioning as a low pass filter that can sufficiently damp an input signal in the frequency band of the electromagnetic interference waves is disposed in the controlling circuit input part, i.e. in the neighborhood of the junction part between one end part of the relay lead part and the pattern on the control substrate having a pattern for the controlling circuit part.

Further, as a third solution in this preferred embodiment, on the basis of the aforementioned first and second solutions, one or two tubular ferrite core parts are disposed to surround the forward path relay lead part and the return path relay lead part of the controlling current IF. This makes it possible to form an LC low pass filter such that, even under a situation in which a magnetic flux of the electromagnetic interference waves is linked with a pair of relay lead parts to generate an electromotive force, the generated electromotive voltage is prevented from being transmitted and input to the controlling circuit input part by suitably setting the inductance value produced by the ferrite core part.

Further, as a fourth solution in this preferred embodiment, on the basis of the aforementioned first and second solutions, a dielectric sandwiched between respective facing parts of the forward path side lead part and the return path side lead part of the controlling current IF is disposed between the forward path and the return path. This solution also aims at reducing the influence of the normal mode noise in the same manner as the previous solutions. Hereafter, the aforementioned first to fourth solutions will be described in detail with reference to the attached drawings.

(First Preferred Embodiment)

Figure 1:
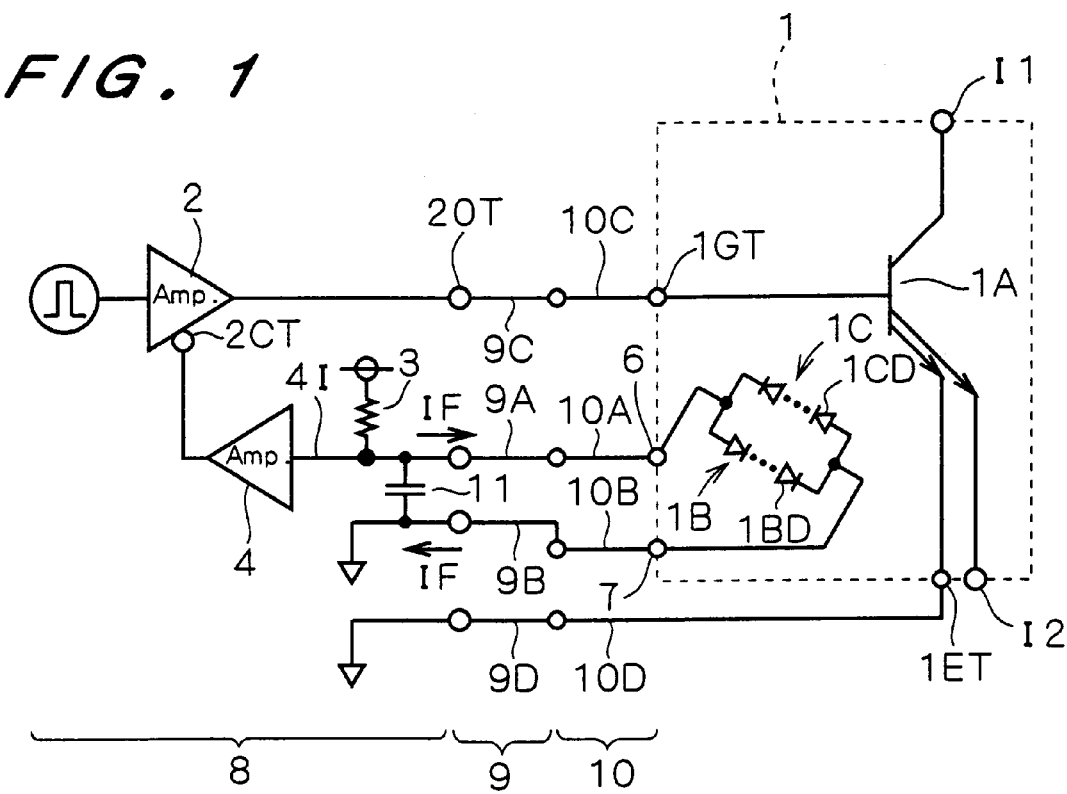
FIG. 1 is a view illustrating a circuit construction of a semiconductor device for electric power according to a first preferred embodiment of the present invention.

FIG. 1 is a block diagram illustrating a circuit construction of a semiconductor device for electric power according to this preferred embodiment. Roughly classified, this device is made of a one-chip semiconductor element 1 for electric power, a bonding wire part 10, a relay lead part 9, and a controlling circuit part 8. The relay lead part 9 and the bonding wire part 10 together form a connection lead part that couples the semiconductor element 1 for electric power and the controlling circuit part 8 with each other. The semiconductor device is accommodated in a resin case joined on the outer peripheral part in the upper surface of a heat-dissipating plate along the outer peripheral part.

First, the semiconductor element 1 for electric power is made of a later-mentioned semiconductor substrate, a semiconductor element part 1A for electric power (here, an IGBT is drawn, but it may be another element part, for example, a longitudinal type power MOSFET) formed on the semiconductor substrate, a first diode part or temperature-sensing diode part 1B formed on the same semiconductor substrate for sensing the junction temperature at the operation time of the semiconductor element part 1A for electric power, and a second diode part or static electricity absorbing diode part 1C formed on the same semiconductor substrate and connected between the two terminals of the first diode part 1B or between the anode side terminal 6 and the cathode side terminal 7 for absorbing static electricity generated in the first diode part 1B to improve the ESD immunity. Further, the first diode part 1B is constructed with n (n≧2) first diodes 1BD connected sequentially in the forward direction, and the second diode part 1C is constructed with n second diodes 1CD connected sequentially in the backward direction. Moreover, the high-frequency impedance characteristic of the first diode 1BD in the frequency band of the electromagnetic interference waves is approximately equal to the high-frequency impedance characteristic of the second diode 1CD in the frequency band of the electromagnetic interference waves, so that the high-frequency impedance characteristic of the first diode part 1B in the frequency band of the electromagnetic interference waves is equivalent to the high-frequency impedance characteristic of the second diode part 1C in the frequency band of the electromagnetic interference waves.

Further, the bonding wire part 10 is made of a forward path side bonding wire part 10A having one end connected to the anode side terminal 6, a backward path side bonding wire part 10B having one end connected to the cathode side terminal 7, and first and second control side bonding wire parts 10C and 10D having one end respectively connected to the control electrodes or control electrode terminals 1GT and 1ET of the semiconductor element part 1A for electric power.

Further, the relay lead part 9 is made of a forward path side relay lead part 9A having one end connected to the other end of the forward path side bonding wire part 10A, a backward path side relay lead part 9B having one end connected to the other end of the backward path side bonding wire part 10B, a first control side relay lead part 9C having one end connected to the other end of the first control side bonding wire part 10C, and a second control side relay lead 9D. Here, the forward path side bonding wire part 10A and the forward path side relay lead part 9A constitute a "forward path side lead part" and, on the other hand, the backward path side bonding wire part 10B and the backward path side relay lead part 9B constitute a "backward path side lead part".

On the other hand, the pattern of the controlling circuit part 8 is formed on a control substrate (not illustrated), and the controlling circuit part 8 has the following elements. Namely, a VF operating amplifying circuit part 4 has an input terminal 4I connected to the other end of the forward path side relay lead part 9A, and receives a forward direction voltage fall (VF) sensed and output by the first diode part 1B to perform an operation of comparing the received signal with a predetermined determination level. If the level of the input received signal exceeds the predetermined determination level, the VF operating amplifying circuit part 4 determines that the junction temperature at the operation time of the semiconductor element part 1A for electric power has risen to an abnormal temperature that causes deterioration of the characteristics and others, and outputs to a control terminal 2CT of an element controlling circuit part 2 a controlling signal indicating that the abnormal junction temperature rise has been detected. Also, an output terminal 2OT of the element controlling circuit part 2 is connected to the control electrode 1GT of the semiconductor element part 1A for electric power via a control side lead part (9C, 10C). Further, a controlling current generating circuit part 3 is made of a power source having a predetermined voltage and a resistor having a predetermined resistance value. An output end of the controlling current generating circuit part 3 is connected to the other end of the forward path side lead part 9A, whereby the controlling current generating circuit part 3 generates and outputs a controlling current IF that is passed through the first diode part 1B. Further, a capacitor 11 (for example, a ceramic capacitor) having one end or first electrode connected to the other end of the forward path side lead part 9A and having the other end or second electrode connected to the other end of the backward path side lead part 9B is disposed as a bypass capacitor in the controlling circuit part 8. The material, the capacitance value, and others of this capacitor 11 are set so as to have a characteristic such that the impedance thereof in the previously described frequency band is lower than the impedance thereof in the other frequency bands. Therefore, the capacitor 11 can function as a low pass filter capable of coupling a noise signal of an electromotive voltage that may possibly be generated between the forward path and the backward path of the controlling current IF due to the high-frequency electromagnetic interference waves.

Here, the triangle symbols drawn at the tip ends of both of the lead parts 9B, 9D in FIG. 1 signify that the tip ends of both parts 9B, 9D are connected to a power source (minus voltage) of a driving circuit (not illustrated) of the semiconductor element 1 for electric power. Also, the operating amplifying circuit part 4 encompasses a standard terminal (not illustrated) connected to the above-mentioned power source (minus voltage).

Figure 2:
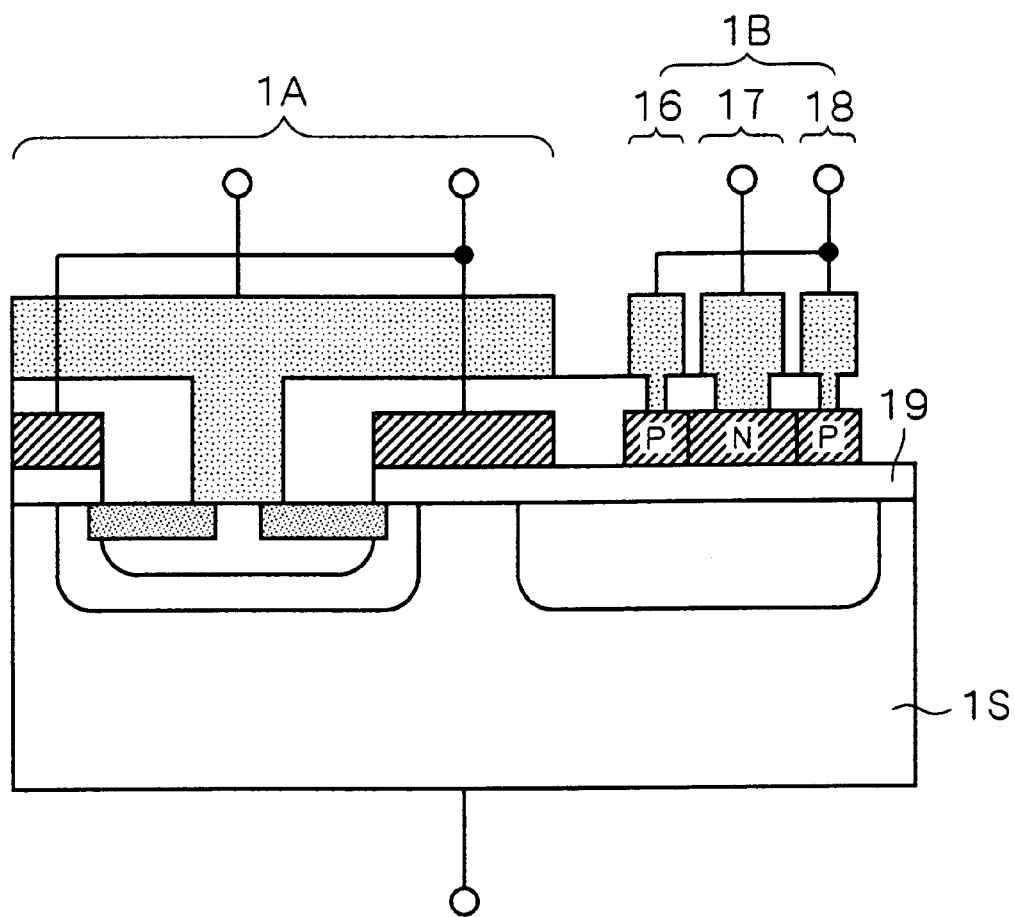
FIG. 2 is a longitudinal cross-section view illustrating a semiconductor element for electric power of the present invention having a semiconductor element part for electric power and a first diode part that are formed on a semiconductor substrate.
Figure 3:
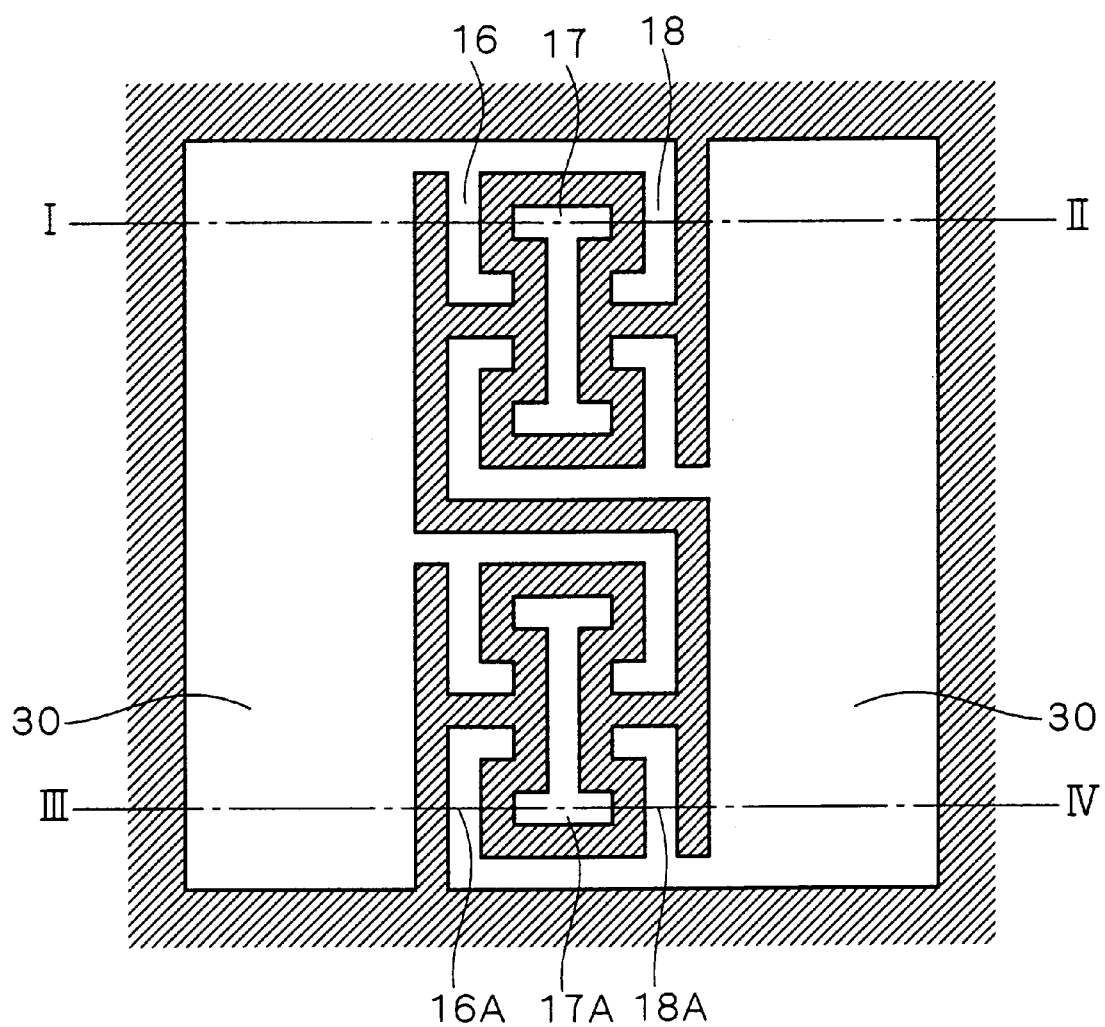
FIG. 3 is a plan view of a semiconductor element for electric power of the present invention illustrating a layout of the first and second diode parts.

Here, FIG. 2 is a longitudinal cross section view illustrating the semiconductor element part 1A for electric power constituting an IGBT and the first diode part 1B made of polycrystal silicon diodes, which are both formed adjacent to each other on the semiconductor substrate 1S for electric power. In FIG. 2, the reference numerals 16 and 18 designate a P-type layer and the reference numeral 17 designates an N-type layer. In the semiconductor element 1 for electric power of this semiconductor device, a polycrystal silicon diode 1B which is electrically insulated from the semiconductor element part 1A for electric power by an insulating oxide film 19 and which has a plurality of P-N junctions arranged in the forward direction is formed on the semiconductor substrate 1S and functions as a highly sensitive junction temperature sensing part. Between the two terminals 6, 7 (See FIG. 1) of the polycrystal silicon diode 1B, a second diode part 1C made of a plurality of second diodes (the number of the second diodes is equal to the number of the first diodes) connected in series in the backward direction is formed on the same semiconductor substrate 1S as an EMI improving part. Here, FIG. 3 is a plan view of the semiconductor substrate 1S illustrating a layout of the first diode part 1B and the second diode part 1C. The reference numeral 30 in FIG. 3 designates a part being subjected to wire bonding. The longitudinal cross section view with respect to the one-dot chain line I–II shown in FIG. 3 corresponds to the figure of the first diode part 1B shown in FIG. 2. The longitudinal cross section structure with respect to the one-dot chain line III–IV in FIG. 3 corresponds to the structure of the second diode part having the same structure as the first diode part 1B shown in FIG. 2. The reference numerals 16A and 18A designate an N-type layer, and the reference numeral 17A designates a P-type layer. Since each of the second diodes 1CD constituting the second diode part 1C is formed as a polycrystal silicon diode on the same semiconductor substrate 1S, each of the second diodes 1CD has a frequency impedance characteristic equivalent to that of the first diode 1BD for sensing the temperature.

The semiconductor device according to this preferred embodiment produces an effect that, even if an electromotive force based on the impedance of the bonding wire part 10 or the relay lead part 9 is generated as a result of couplings (electrostatic coupling and electromagnetic coupling) generated between the heat-dissipating plate and the paths of the controlling current IF of the temperature-sensing diode part 1B constructed with the bonding wire part 10 and the relay lead part 9 in FIG. 1, or between the aforementioned paths and the earth ground, or between the aforementioned paths and the electrode for large electric current that is input to and output from the semiconductor element 1 for electric power due to the influence of the high-frequency electromagnetic interference waves generated in the neighborhood of the semiconductor element 1A for electric power, the electromotive force due to the influence of the electromagnetic interference waves generated between the forward path and the return path of the controlling current IF for sensing the temperature does not contribute so much as to give an influence on the sensitivity of the temperature-sensing diode part 1B, because the first and second diode parts 1B, 1C in both directions without having a difference in the high-frequency impedance characteristics from each other are formed in the diode forming part on the semiconductor substrate 1S. In addition, this device further produces an effect that, since the capacitor 11 of ceramics or the like having a low impedance characteristic to high-frequency waves is mounted on the signal input part of the controlling circuit part 8, the capacitor 11 can function as a low pass filter capable of sufficiently damping the level of the input signal in the frequency band of the electromagnetic interference waves, so that the electromotive force due to the influence of the electromagnetic interference waves generated between the forward path and the return path of the controlling current IF for sensing the temperature does not contribute so much as to give an influence on the sensitivity of the temperature-sensing diode part 1B.

Here, the number of the second diodes 1CD constituting the second diode part 1C may be different from the number of the first diodes 1BD constituting the first diode part 1B as long as the above-mentioned high-frequency impedance characteristic of the second diode part 1C itself is the same as that of the first diode part 1B. For example, the number of the second diodes 1CD may be one.

(Second Preferred Embodiment)

This preferred embodiment is characterized in that, in addition to the characteristic construction of a first preferred embodiment, a construction is added such that "the forward path side relay lead part 9A and the backward path side relay lead part 9B are surrounded with a ferrite core part". Hereafter, its characteristic construction will be described with reference to the attached drawings.

Figure 4:
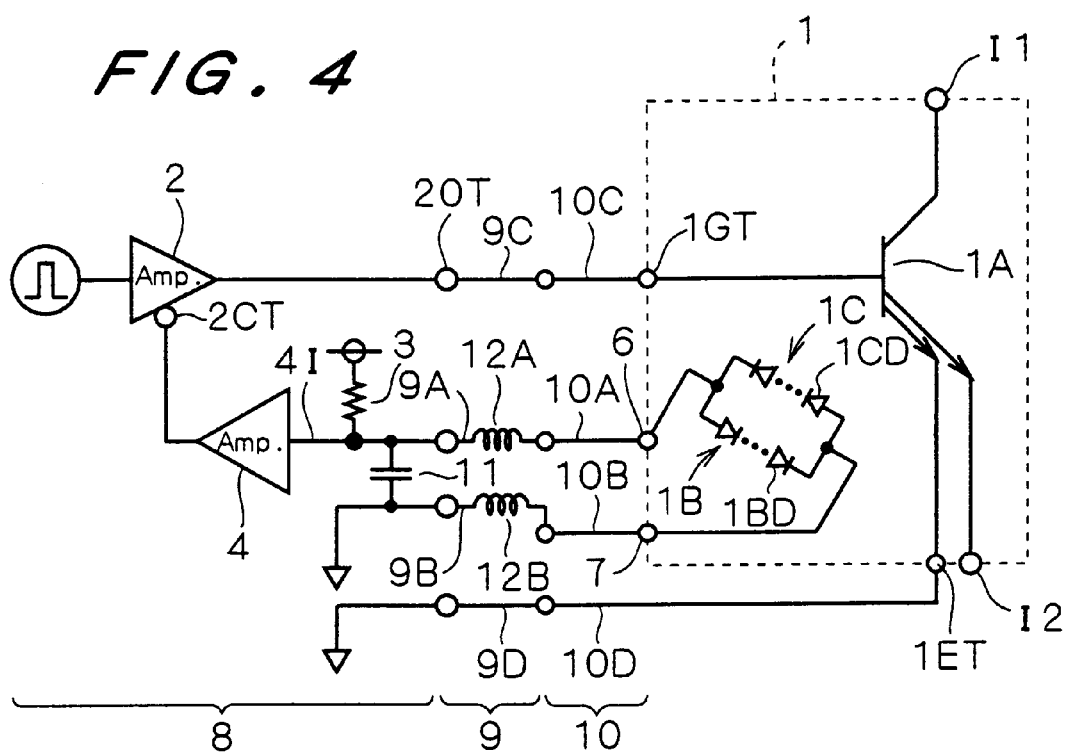
FIG. 4 is a view illustrating a circuit construction of a semiconductor device for electric power according to a second preferred embodiment of the present invention.

FIG. 4 is a block diagram illustrating a construction of an equivalent circuit of a semiconductor device for electric power according to this preferred embodiment. The circuit construction of FIG. 4 is different from the circuit construction of FIG. 1 in that (1) in addition to a parasitic inductance that the forward path side relay lead part 9A itself has, the forward path side relay lead part 9A has a first inductance 12A produced by a later-mentioned tubular first ferrite core and having a larger value than the aforesaid parasitic inductance, and that (2) in addition to a parasitic inductance that the backward path side relay lead part 9B itself has, the backward path side relay lead part 9B has a second inductance 12B produced by a later-mentioned tubular second ferrite core and having a larger value than the aforesaid parasitic inductance. This allows the two inductances 12A and 12B to induce a mutual induction, and constitutes an LC low pass filter between the two inductances and the capacitor 11. At this time, by suitably setting the value of each of the inductances 12A, 12B and the capacitance value of the capacitor 11, an LC low pass filter can be constructed which exhibits a characteristic of shutting off the input signal in the frequency band of the electromagnetic interference waves.

Figure 5:
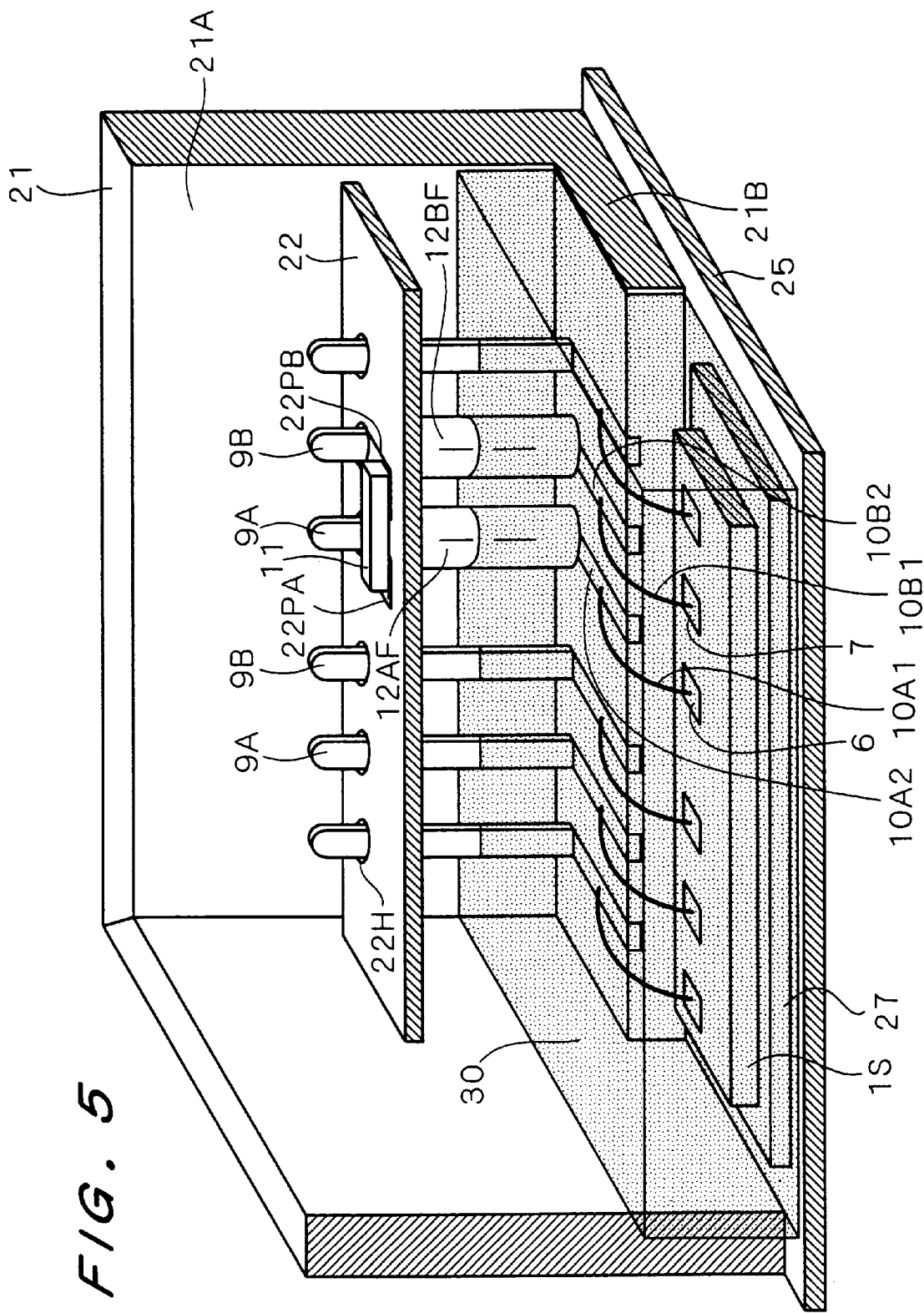
FIG. 5 is a perspective view illustrating an internal structure of a semiconductor device for electric power according to a second preferred embodiment of the present invention.

FIG. 5 is a perspective view illustrating an internal structure of the semiconductor device for electric power according to this preferred embodiment shown in FIG. 4 with its portion shown in a cross-sectional view form.

Referring to FIG. 5, the bottom part of the resin case 21 is fixed onto the outer peripheral part of the upper surface of the previously described heat-dissipating plate 25. Moreover, the bottom part 21B of the inside wall surface of one side surface part 21A along the longitudinal direction of the case 21 has a shape that protrudes towards the inside space of the case 21. In other words, the longitudinal cross section shape of the above-mentioned side surface part 21A has an L-letter shape. Further, the lower surface of the semiconductor substrate 1S is stuck onto the upper surface of the insulating substrate 27 fixed onto the upper surface of the heat-dissipating plate 25 so that the semiconductor substrate 1S is disposed to face the bottom part 21B. As shown in FIGS. 2 and 3, the semiconductor element part 1A for electric power and the first and second diode parts 1B, 1C are formed on the upper surface of the semiconductor substrate 1S. Further, a plurality of linear lead patterns 10A2, 10B2, to which one end of later-mentioned bonding wires 10A1, 10B1 are to be respectively press-bonded, are formed on the upper surface of the bottom part 21B of the resin case 21. Namely, referring to FIG. 5, the forward path side bonding wire part 10A shown in FIGS. 1 and 4 is made of a forward path side bonding wire 10A1 whose other end is press-bonded to a forward path side pad 6 (corresponding to the anode side terminal) disposed on the upper surface of the semiconductor substrate 1S and a forward path side lead pattern 10A2. Similarly, the backward path side bonding wire part 10B shown in FIGS. 1 and 4 is made of a backward path side bonding wire 10B1 whose other end is press-bonded to a backward path side pad 7 (corresponding to the cathode side terminal) disposed on the upper surface of the semiconductor substrate 1S and a backward path side lead pattern 10B2. Further, one end part of the forward path side relay lead part 9A and the backward path side relay lead part 9B both having a rectangular parallelopiped plate shape is joined respectively to the other end of the forward path side lead pattern 10A2 and the backward path side lead pattern 10B2. Furthermore, as a kernel portion of this preferred embodiment, the forward path side relay lead part 9A excluding its other end part is inserted or fitted with clearance into a through-hole (not illustrated) of one tubular first ferrite core 12AF, thereby to be surrounded by the first ferrite core 12AF. Here, an adhesive (not illustrated) is poured between a wall surface of the through-hole of the first ferrite core 12AF and a principal part on the surface of the forward path side relay lead part 9A which is inserted into the above-mentioned through-hole. Similarly, the backward path side relay lead part 9B excluding its other end part is inserted with clearance into a through-hole (not illustrated) of one tubular second ferrite core 12BF, and the gap between the two parts 9B, 12BF is filled with an adhesive (not illustrated) for bonding the two parts 9B, 12BF with each other for fixation.

On the other hand, the control substrate 22 for the controlling circuit part is mounted on a supporting part (not illustrated), which is disposed on the inner wall surface of the side surface part 21A of the resin case 21 and whose longitudinal cross section has, for example, an L-letter shape, and the control substrate 22 is fixed to the supporting part by soldering or the like. Circuit patterns (not illustrated) of the controlling circuit part 8 of FIGS. 1 and 4 is formed on the upper surface of the control substrate 22 (although not illustrated, necessary electronic components are mounted on the circuit patterns), and through-holes 22H are disposed in the control substrate 22 for inserting the other end of each of the above-mentioned forward path side relay lead part 9A and backward path side relay lead part 9B. This allows the other end of the forward path side relay lead part 9A to be inserted into the corresponding through-hole 22H of the control substrate 22, and the portion protruding from the aforesaid through-hole 22H is soldered to a forward path side pad 22PA disposed around the aforesaid through-hole 22H. Similarly, the other end of the backward path side relay lead part 9B is inserted into the corresponding through-hole 22H of the controlling circuit substrate 22, and the portion protruding from the aforesaid through-hole 22H is soldered to a backward path side pad 22PB disposed around the aforesaid through-hole 22H. Moreover, the capacitor 11 shown in FIGS. 1 and 4 is soldered between the forward path side pad 22PA and the backward path side pad 22PB.

Here, in FIG. 5, a state is illustrated in which only one pair of relay lead parts 9 (9A, 9B) are inserted into the through-holes of the tubular first and second ferrite cores 12AF, 12BF; however, this is only for the sake of illustration, so that any number of pairs of relay lead parts 9 are respectively surrounded by the corresponding first and second ferrite cores 12AF, 12BF.

Further, as exemplified in FIG. 5, the inside space of the resin case 21 may be filled with a gel 30 so as to bury the semiconductor substrate 1S, the bottom part 21B, and the intermediate portions of the first and second ferrite cores 12AF, 12BF. By this, the fixation degree of the first and second ferrite cores 12AF, 12BF will be more firm.

Here, the construction in FIG. 5 excluding the first and second ferrite cores 12AF, 12BF corresponds to the internal structure of the semiconductor device for electric power according to a first preferred embodiment shown in FIG. 1.

The semiconductor device for electric power of this preferred embodiment produces an effect that, even if a situation occurs in which a magnetic flux of the high-frequency electromagnetic interference waves links with the electric current loop made of the forward path and the return path of the controlling current IF of the temperature-sensing diode part 1B, which are constructed with the bonding wire part 10 and the relay lead part 9 of FIG. 4, the influence of the electromotive force between the forward path and the return path given on the sensitivity of the temperature-sensing diode part 1B can be shut off by means of the LC low pass filter formed with the tubular first and second ferrite cores 12AF, 12BF, into which the respective relay lead parts 9A, 9B of the forward path and the return path are inserted, and the capacitor 11 mounted to the signal input part of the controlling circuit part 8.

(Modified Example of the Second Preferred Embodiment)

Figure 6:
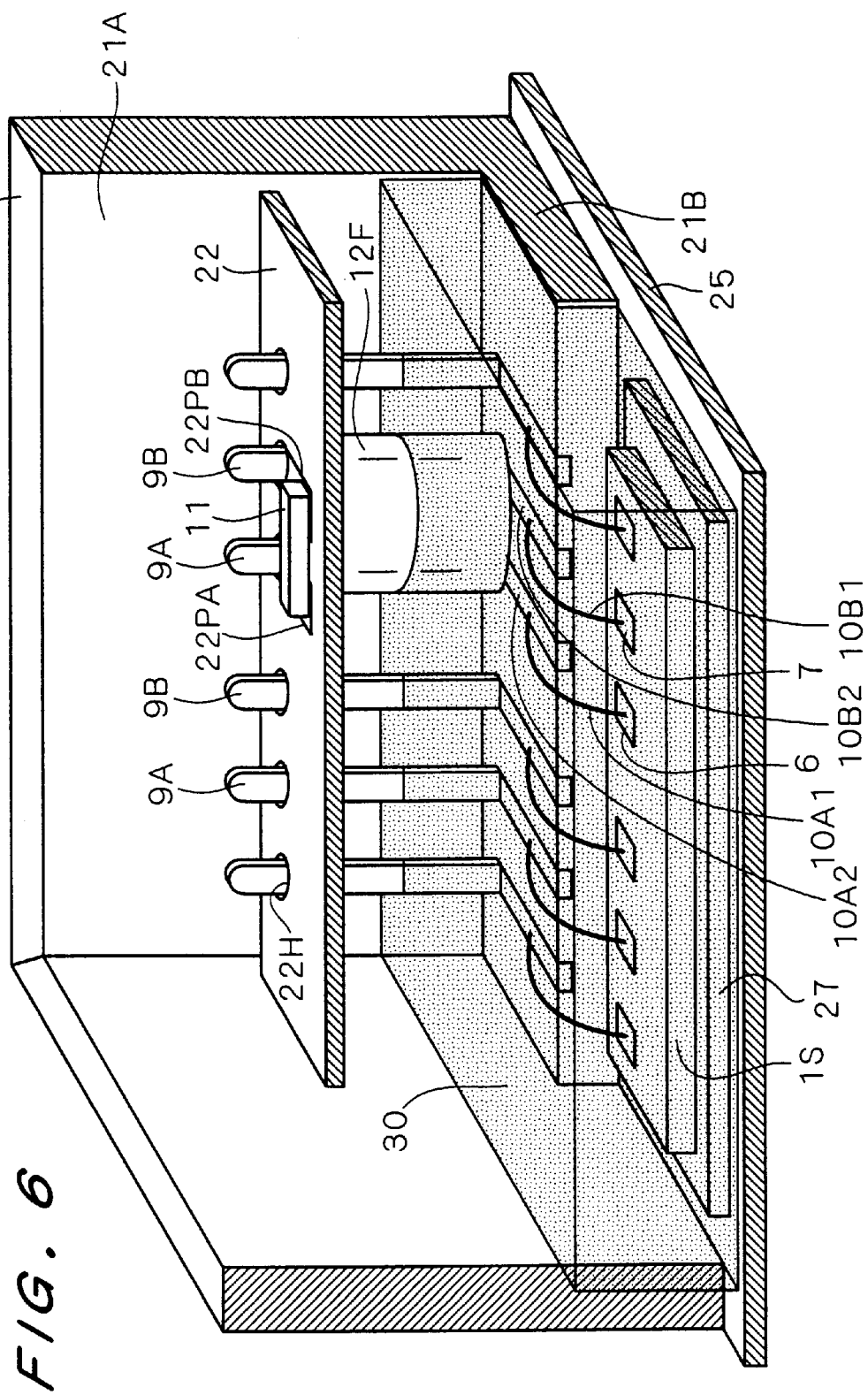
FIG. 6 is a perspective view illustrating an internal structure of a semiconductor device for electric power according to a modified example of a second preferred embodiment of the present invention.

FIG. 6 shows a modified example of the second preferred embodiment in which the relay terminals of the present invention are inserted into the through-holes of the tubular ferrite cores. The structure of the semiconductor device for electric power shown in FIG. 6 differs from that of the second preferred embodiment shown in FIG. 5 in that the principal part of the forward path side relay lead part 9A and the principal part of the return path side relay part 9B through which the controlling current IF of the temperature-sensing diode part flows are together inserted into and surrounded by a through-hole (not illustrated) of one tubular ferrite core 12F. Here, a gap between the principal parts of the two relay lead parts 9A, 9B and the above-mentioned through-hole is filled with the previously described adhesive in a similar manner. Also, as shown in FIG. 6, the space within the resin case 21 may be filled with a gel 30 to reinforce the fixation of the ferrite core 12F.

By this, the mutual inductance M in the mutual induction of the first and second inductances 12A, 12B produced by the ferrite core 12F can be increased as compared with the case of the second preferred embodiment, whereby the signal shutoff property of the LC filter can be improved (the damping amount of the filter can be increased).

(Third Preferred Embodiment)

This preferred embodiment pertains to an improvement of the first preferred embodiment, and is characterized in that a dielectric sandwiched between the respective facing parts of the forward path side lead part (particularly its relay lead part) and the backward path side lead part (particularly its relay lead part) is disposed to form a capacitor group between the forward path side lead part and the backward path side lead part.

Figure 7:
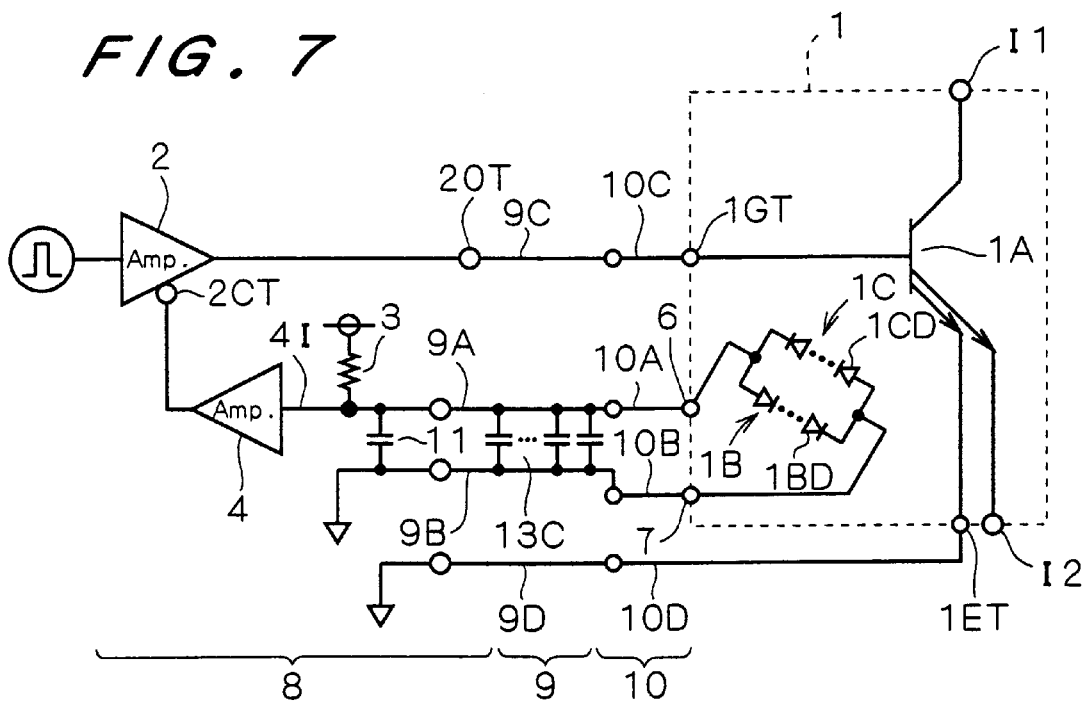
FIG. 7 is a view illustrating a circuit construction of a semiconductor device for electric power according to a third preferred embodiment of the present invention.

FIG. 7 is a view illustrating a circuit construction of a semiconductor device for electric power according to this preferred embodiment. FIG. 7 differs from FIG. 1 in that a capacitor group 13C is disposed between the forward path side relay lead part 9A and the backward path side relay lead part 9B. This capacitor group 13C is made of the following dielectric 13. Here, mica, ceramic, silicon, and others may be mentioned as an example of the dielectric 13.

Figure 8:
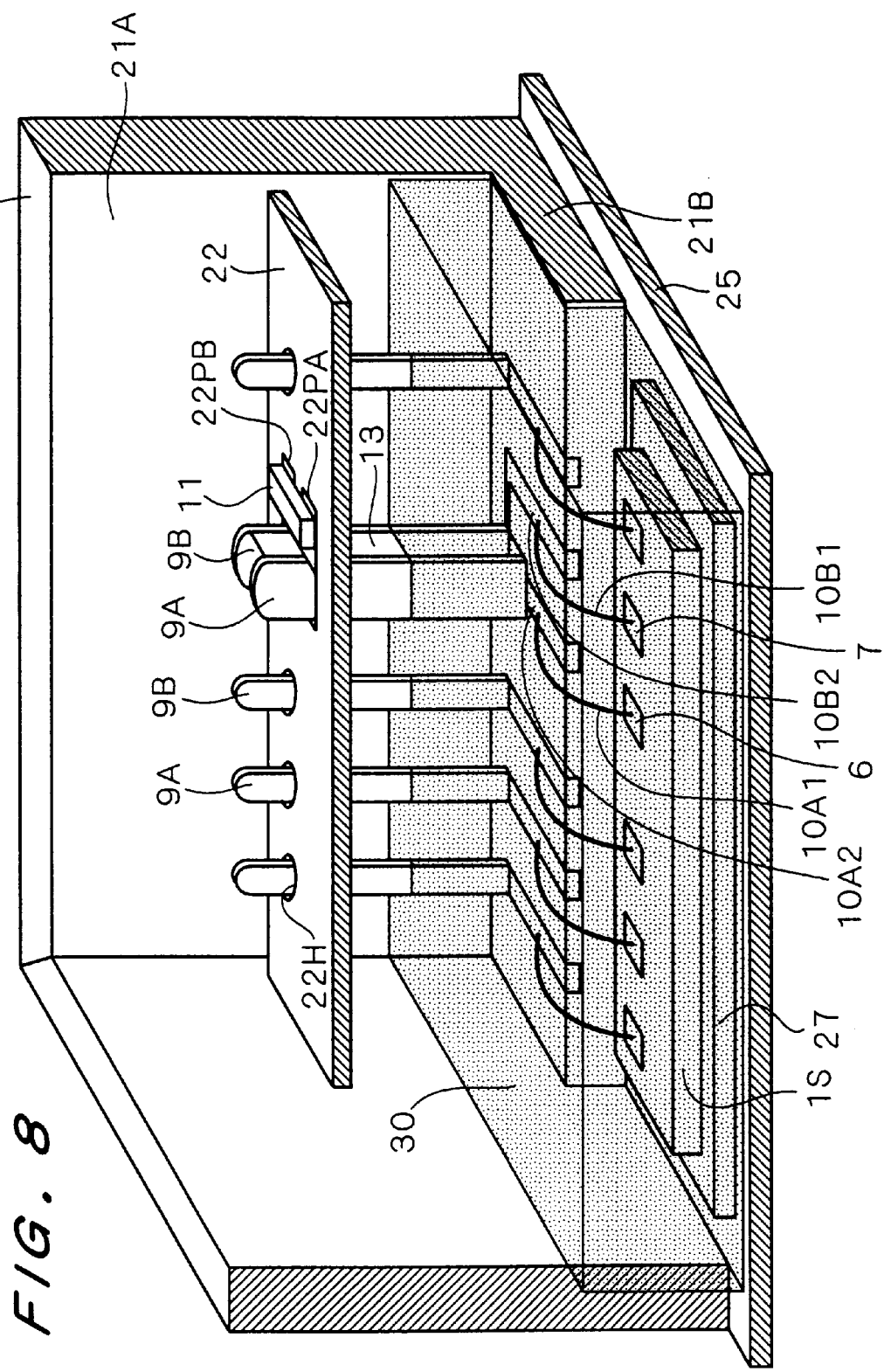
FIG. 8 is a perspective view illustrating an internal structure of a semiconductor device for electric power according to a third preferred embodiment of the present invention.

FIG. 8 is a perspective view illustrating an internal structure of the semiconductor device for electric power of this preferred embodiment, and its characteristic point lies in that the dimension between the forward path side relay lead part 9A and the return path side relay lead part 9B through which the controlling current IF of the temperature-sensing diode part 1B flows is set to be sufficiently small, and a dielectric 13 is inserted therebetween. Namely, though the forward path side lead pattern 10A2 is the same as that of FIG. 5, the backward path side lead pattern 10B2 has an L-letter shape, and the other end part of the above-mentioned pattern 10B2, to which one end part of the backward path side relay lead part 9B is to be joined, faces the other end of the corresponding forward path side lead pattern 10A2. Therefore, the forward path side relay lead part 9A and the backward path side relay lead part 9B, whose one end part is respectively connected to the other end of the lead patterns 10A2, 10B2, face each other, and the dielectric 13 is inserted between the two relay lead parts 9A, 9B. As a result of this, the relay lead parts 9A, 9B form two electrodes of the capacitor group 13C in FIG. 7.

Here, the semiconductor substrate 1S having the temperature-sensing diode part 1B, the static electricity absorbing diode part 1C, and the semiconductor element part 1A for electric power as well as the control substrate 23 having the capacitor 11 mounted thereon have constructions equivalent to those previously described in the first and second preferred embodiments.

According to the semiconductor device for electric power of this preferred embodiment, since the forward path side and backward path side relay lead parts 9A, 9B facing each other in FIG. 8 have a configuration such that the area of the electric current loop formed by the forward path and the return path of the controlling current IF of the temperature-sensing diode part 1B can be made very small, the number of the magnetic fluxes that link with the above-mentioned electric current loop by the high-frequency electromagnetic interference waves can be reduced to induce a smaller electromotive force. Moreover, as shown in FIGS. 7 and 8, the inductance of the forward path side and backward path side relay lead parts 9A, 9B themselves can be reduced by insertion of the dielectric 13. Thus, the configuration of this relay lead part 9 produces an effect that the electromotive voltage induced by electromagnetic induction between the forward path and the return path of the bonding wire part 10 can be restrained to the minimum, thereby to prevent this electromotive voltage from giving an influence on the sensitivity of the temperature-sensing diode part 1B.

While the invention has been shown and described in detail, the foregoing description is in all aspects illustrative and not restrictive. It is therefore understood that numerous other modifications and variations can be devised without departing from the scope of the invention.

What is claimed is:

1. A semiconductor element for electric power, comprising:
   a semiconductor substrate;
   a semiconductor element part for electric power formed on said semiconductor substrate;
   a first diode part formed on said semiconductor substrate for sensing a temperature of said semiconductor element part for electric power; and
   a second diode part formed on said semiconductor substrate and connected between two terminals of said first diode part for absorbing static electricity,
   wherein said first diode part comprises a plurality of first diodes connected sequentially in a forward direction,
   said second diode part comprises at least one second diode connected in a backward direction, and
   a high frequency impedance characteristic of said second diode part in a frequency band of an electromagnetic interference wave that can be generated in a neighborhood of said semiconductor element part for electric power is equivalent to a high frequency impedance characteristic of said first diode part in said frequency band.

2. The semiconductor element for electric power according to claim 1,
   wherein said second diode part comprises a plurality of second diodes connected sequentially in the backward direction,
   the number of said plurality of second diodes is equal to the number of said plurality of first diodes, and
   a high frequency impedance characteristic of each of said plurality of second diodes in said frequency band is equivalent to a high frequency impedance characteristic of each of said plurality of first diodes in said frequency band.

3. A semiconductor device for electric power, comprising:
   the semiconductor element for electric power according to claim 1;
   a forward path side lead part having one end connected to an anode side terminal of said first diode part of said semiconductor element for electric power;
   a backward path side lead part having one end connected to a cathode side terminal of said first diode part of said semiconductor element for electric power;
   an operating amplifying circuit part having an input terminal connected to the other end of said forward path side lead part;
   a control current generating circuit part connected to said other end of said forward path side lead part and configured to generate a control current of said first diode part; and
   an element controlling circuit part having a control terminal connected to an output terminal of said operating amplifying circuit part and having an output terminal connected to a control electrode of said semiconductor element part for electric power of said semiconductor element for electric power.

4. The semiconductor device for electric power according to claim 3, further comprising:
   a capacitor having one end connected to said other end of said forward path side lead part and having the other end connected to the other end of said backward path side lead part,
   wherein said capacitor has an impedance characteristic such that an impedance thereof in said frequency band is lower than an impedance thereof outside said frequency band.

5. The semiconductor device for electric power according to claim 4, wherein
   said forward path side lead part comprises:
   a forward path side bonding wire part having one end connected to said anode side terminal; and
   a forward path side relay lead part having one end connected to the other end of said forward path side bonding wire part,
   said backward path side lead part comprises:
   a backward path side bonding wire part having one end connected to said cathode side terminal; and a backward path side relay lead part having one end connected to the other end of said backward path side bonding wire part, and said forward path side relay lead part and said backward path side relay lead part are surrounded by a ferrite core part.

6. The semiconductor device for electric power according to claim 5, wherein said ferrite core part is made of one tubular ferrite core.

7. The semiconductor device for electric power according to claim 5, wherein said ferrite core part comprises a tubular first ferrite core and a tubular second ferrite core, said forward path side relay lead part is surrounded by said first ferrite core, and said backward path side relay lead part is surrounded by said second ferrite core.

8. The semiconductor device for electric power according to claim 3, further comprising:

a dielectric that is sandwiched between respective facing parts of said forward path side lead part and said backward path side lead part.

9. The semiconductor device for electric power according to claim 4, further comprising:

a dielectric that is sandwiched between respective facing parts of said forward path side lead part and said backward path side lead part.

10. A semiconductor device for electric power, comprising:

the semiconductor element for electric power according to claim 2;

a forward path side lead part having one end connected to an anode side terminal of said first diode part of said semiconductor element for electric power;

a backward path side lead part having one end connected to a cathode side terminal of said first diode part of said semiconductor element for electric power;

an operating amplifying circuit part having an input terminal connected to the other end of said forward path side lead part;

a control current generating circuit part connected to said other end of said forward path side lead part and configured to generate a control current of said first diode part; and an element controlling circuit part having a control terminal connected to an output terminal of said operating amplifying circuit part and having an output terminal connected to a control electrode of said semiconductor element part for electric power of said semiconductor element for electric power.

11. The semiconductor device for electric power according to claim 10, further comprising:

a capacitor having one end connected to said other end of said forward path side lead part and having the other end connected to the other end of said backward path side lead part, wherein said capacitor has an impedance characteristic such that an impedance thereof in said frequency band is lower than an impedance thereof outside said frequency band.

12. The semiconductor device for electric power according to claim 11, wherein said forward path side lead part comprises:

a forward path side bonding wire part having one end connected to said anode side terminal; and a forward path side relay lead part having one end connected to the other end of said forward path side bonding wire part, said backward path side lead part comprises:

a backward path side bonding wire part having one end connected to said cathode side terminal; and a backward path side relay lead part having one end connected to the other end of said backward path side bonding wire part, and said forward path side relay lead part and said backward path side relay lead part are surrounded by a ferrite core part.

13. The semiconductor device for electric power according to claim 11, further comprising:

a dielectric that is sandwiched between respective facing parts of said forward path side lead part and said backward path side lead part.

* * * * *